(12) United States Patent
Komatsu et al.

(10) Patent No.: US 10,284,111 B2
(45) Date of Patent: May 7, 2019

(54) POWER CONVERSION APPARATUS HAVING CONNECTION CONDUCTORS HAVING INDUCTANCE WHICH INHIBITS RIPPLE CURRENT

(71) Applicants: Toshiba Mitsubishi-Electric Industrial Systems Corporation, Chuo-ku (JP); Mitsubishi Electric Corporation, Chiyoda-ku (JP)

(72) Inventors: Hiroyoshi Komatsu, Tokyo (JP); Manabu Souda, Tokyo (JP); Kimiyuki Koyanagi, Tokyo (JP)

(73) Assignees: TOSHIBA MITSUBISHI—ELECTRIC INDUSTRIAL SYSTEMS CORPORATION, Chuo-ku (JP); Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 14/555,986

(22) Filed: Nov. 28, 2014

(65) Prior Publication Data

US 2015/0085549 A1 Mar. 26, 2015

Related U.S. Application Data

(63) Continuation of application No. PCT/JP2012/064187, filed on May 31, 2012.

(51) Int. Cl.
*H02M 7/537* (2006.01)
*H02M 5/458* (2006.01)
(Continued)

(52) U.S. Cl.
CPC ............... *H02M 7/537* (2013.01); *H02J 3/01* (2013.01); *H02M 1/14* (2013.01); *H02M 5/4585* (2013.01);
(Continued)

(58) Field of Classification Search
CPC .... H02M 7/537; H02M 5/4585; H02M 7/003; H02M 7/493; H02M 1/14; H02M 7/49;
(Continued)

(56) References Cited

U.S. PATENT DOCUMENTS 4,868,732 A * 9/1989 Gillett .................. G06K 7/0008
336/216
5,253,156 A * 10/1993 Sakurai ............. H01L 21/76297
257/E21.56
(Continued)

FOREIGN PATENT DOCUMENTS

CN 101258670 A 9/2008
EP 2 192 678 A1 6/2010
(Continued)

OTHER PUBLICATIONS

International Preliminary Report on Patentability and Written Opinion dated Dec. 11, 2014 in PCT/JP2012/064187 (English Translation only).
(Continued)

*Primary Examiner* — Henry E Lee, III
(74) *Attorney, Agent, or Firm* — Oblon, McClelland, Maier & Neustadt, L.L.P.

(57) ABSTRACT

A power conversion apparatus includes a first power conversion circuit including a first switching element, a second power conversion circuit including a second switching element, a DC conductor which is provided in the first power conversion circuit and supplies a DC power to the first power conversion circuit, and a connection conductor which is provided in the first power conversion circuit, has a length having an inductance for inhibiting a flow of a ripple current caused by switching of the second switching element of the second power conversion circuit, and connects the DC conductor and the second power conversion circuit.

3 Claims, 3 Drawing Sheets

(51) Int. Cl.
  *H02M 7/00* (2006.01)
  *H02M 7/493* (2007.01)
  *H02M 1/14* (2006.01)
  *H02J 3/01* (2006.01)
  *H05K 7/14* (2006.01)

(52) U.S. Cl.
  CPC ............ *H02M 7/003* (2013.01); *H02M 7/493* (2013.01); *H05K 7/1432* (2013.01); *Y02E 40/40* (2013.01)

(58) Field of Classification Search
  CPC ......... H02M 2001/0074; H02M 1/126; H02M 2007/4835; H02M 5/225; H02M 7/4807; H02J 3/01; H02J 3/36
  See application file for complete search history.

(56) References Cited

U.S. PATENT DOCUMENTS

| | | | |
|---|---|---|---|
| 5,289,364 A | 2/1994 | Sakurai | |
| 5,671,134 A * | 9/1997 | Nomura | H02M 7/003 363/132 |
| 2008/0205093 A1* | 8/2008 | Davies | H02J 3/1864 363/35 |
| 2011/0044077 A1 | 2/2011 | Nielsen | |

FOREIGN PATENT DOCUMENTS

| | | |
|---|---|---|
| JP | 07-123724 A | 5/1995 |
| JP | 11-89249 A | 3/1999 |
| JP | 2000-60148 A | 2/2000 |
| JP | 2006-203974 A | 8/2006 |
| JP | 2011-015455 A | 1/2011 |
| JP | 2012-095472 A | 5/2012 |
| WO | WO 2007/028349 A1 | 3/2007 |
| WO | WO 2009/040933 A1 | 4/2009 |

OTHER PUBLICATIONS

International Search Report dated Sep. 4, 2012 for PCT/JP2012/064187 filed May 31, 2012 with English Translation.
International Written Opinion dated Sep. 4, 2012 for PCT/JP2012/064187 filed May 31, 2012.
Extended European Search Report dated Mar. 15, 2016 in European Patent Application No. 12877714.1.
Combined Chinese Office Action and Search Report dated Jun. 22, 2016 in Patent Application No. 201280073645.7 (with Partial English language translation and English translation of categories of cited documents).
Office Action dated Dec. 7, 2016 in European Patent Application No. 12877714.1.
Office Action dated Jun. 30, 2015 in Japanese Patent Application No. 2014-518187 (with English language translation).

* cited by examiner

POWER CONVERSION APPARATUS HAVING CONNECTION CONDUCTORS HAVING INDUCTANCE WHICH INHIBITS RIPPLE CURRENT

CROSS REFERENCE TO RELATED APPLICATIONS

This application is a Continuation Application of PCT Application No. PCT/JP2012/064187, filed May 31, 2012, the entire contents of which are incorporated herein by reference.

BACKGROUND OF THE INVENTION

1. Field of the Invention

The present invention relates generally to a power conversion apparatus.

2. Description of the Related Art

In general, to constitute a power conversion apparatus with a large capacity, the direct current (DC) sides power conversion circuits are connected in parallel. Many power conversion apparatuses are configured to decrease an impedance component and so reduce the loss. For example, it is known that a capacitor and a semiconductor element constituting a power conversion circuit are connected to a laminated conductor having a thin-plate shape to reduce an inductance component. In addition, a structure in which a plurality of inverters are connected via damping resistors to prevent ripple currents among the inverters is disclosed (for example, refer to Jpn. Pat. Appln. KOKAI Publication No. 7-123724). Further, a power conversion apparatus configured to improve the nonuniformity of the power path to realize a large current is disclosed (for example, refer to Jpn. Pat. Appln. KOKAI Publication No. 2012-95472).

However, in the case of a power conversion apparatus in which a plurality of power conversion circuits are connected in parallel, a ripple current generated in a power conversion circuit by the switching due to the pulse width modulation (PWM) control flows into another power conversion circuit. This ripple current is difficult to reduce in a power conversion apparatus configured to reduce impedance components. Therefore, the ripple current has a significant influence on the power conversion apparatus.

When components such as reactors and resistors are provided to reduce the ripple current, the power conversion apparatus becomes large. When a power conversion circuit is unitized, it is difficult to ensure sufficient space for components such as reactors and resistors in the unit.

BRIEF SUMMARY OF THE INVENTION

An object of the present invention is to provide a power conversion apparatus which includes power conversion circuits, inhibits a ripple current flowing between the power conversion circuits as a result of switching and is reduced in size.

A power conversion apparatus according to an aspect of the present invention comprises a first power conversion circuit including a first switching element; a second power conversion circuit including a second switching element; a DC conductor which is provided in the first power conversion circuit and supplies a DC power to the first power conversion circuit; and a connection conductor which is provided in the first power conversion circuit, has a length having an inductance for inhibiting a flow of a ripple current caused by switching of the second switching element of the second power conversion circuit, and connects the DC conductor and the second power conversion circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

DETAILED DESCRIPTION OF THE INVENTION

Embodiments will be described hereinafter with reference to the accompanying drawings.

(First Embodiment)

Figure 1:
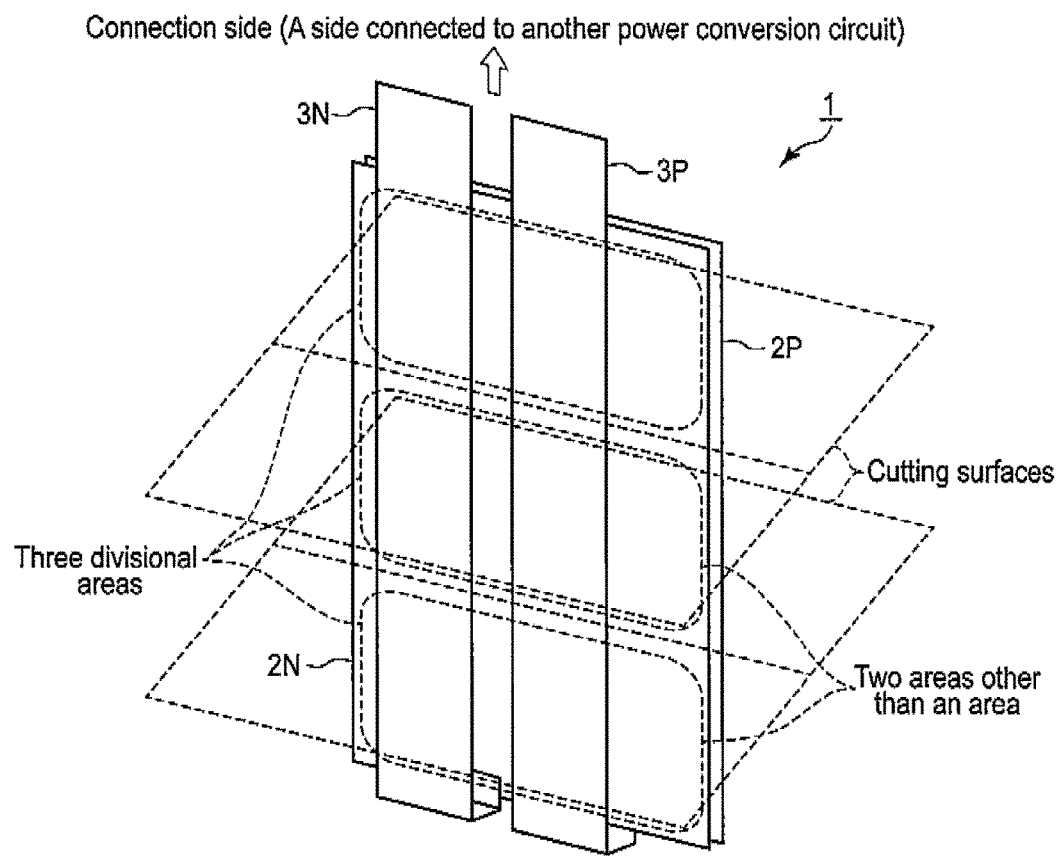
FIG. 1 is a structural diagram showing a structure of a power conversion unit according to a first embodiment of the present invention.
Figure 2:
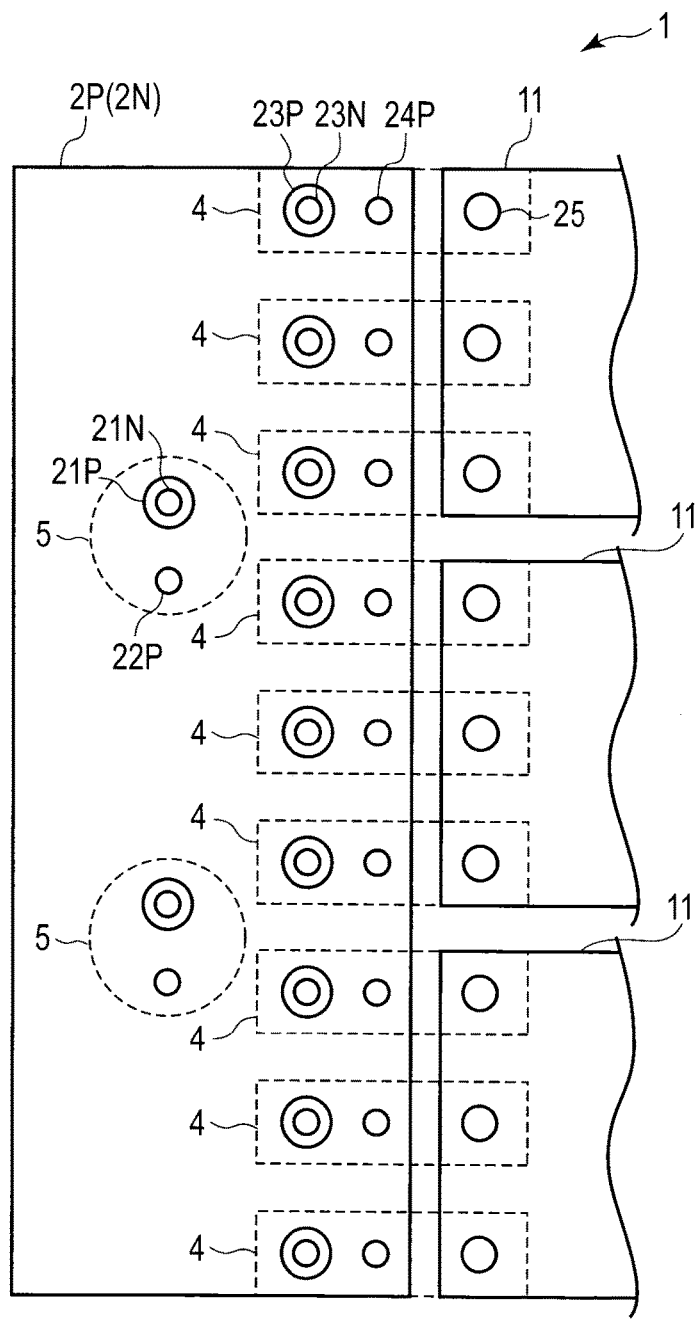
FIG. 2 is a structural diagram showing an attachment state of elements of the power conversion unit according to the first embodiment.
Figure 3:
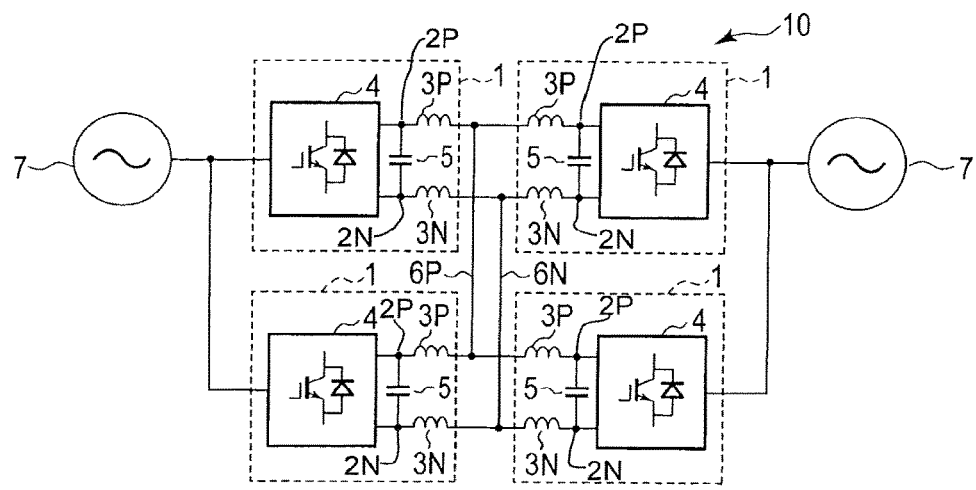
FIG. 3 is a structural diagram showing a structure of a power conversion apparatus including four power conversion units according to the first embodiment.

FIG. 1 is a structural diagram showing a structure of a power conversion unit 1 according to a first embodiment of the present invention. FIG. 2 is a structural diagram showing an attachment state of elements 4 and 5 of the power conversion unit 1 according to the present embodiment. FIG. 3 is a structural diagram showing a structure of a power conversion apparatus 10 including four power conversion units 1 according to the present embodiment. In the drawings, the same components are designated by the same reference numbers. Thus, detailed explanations of such components are omitted, and different components are mainly explained. Overlapping explanations are omitted in another embodiment as well.

The power conversion apparatus 10 includes four power conversion units 1. The DC sides of all of the power conversion units 1 are connected in parallel by two DC bus conductors 6P and 6N. The positive-electrode-side DC bus conductor 6P electrically connects the positive terminals of all of the power conversion units 1. The negative-electrode-side DC bus conductor 6N electrically connects the negative terminals of all of the power conversion units 1.

Each power conversion unit 1 is a three-phase inverter which converts DC power into three-phase alternating current (AC) power. The power conversion unit 1 also converts three-phase AC power into DC power. The power conversion unit 1 is prepared by unitizing a power conversion circuit (inverter). A power system 7 is connected to the AC side of each of the four power conversion units 1. The power conversion apparatus 10 utilizes an interchange power between two power systems 7. One of an AC source and an AC load may be used for each power system 7, or both of them may be used for each power system 7. The power system 7 may be a commercial system.

The power conversion unit 1 includes a positive-electrode DC conductor 2P, a negative-electrode DC conductor 2N, a positive-electrode-side DC connection bus 3P, a negative-electrode-side DC connection 3N, insulated gate bipolar transistors (IGBT) 4 and capacitors 5.

IGBTs 4 and capacitors 5 are located on the flat surface of the positive-electrode DC conductor 2P. The positive terminals of the IGBTs 4 and the capacitors 5 are connected to the positive-electrode DC conductor 2P. The negative terminals of the IGBTs 4 and the capacitors 5 are connected to the negative-electrode DC conductor 2N.

The IGBTs 4 and the capacitors 5 are elements constituting a power conversion circuit for three phases. In the power conversion unit 1, the IGBTs 4 and the capacitors 5 are provided to constitute a power conversion circuit for three phases. More than one IGBT 4 and more than one capacitor 5 are connected in series or in parallel to increase each capacity. By using the power conversion circuit structured in this way, conversion between DC power and AC power is performed.

Each IGBT 4 is a semiconductor including a switching element to conduct a switching operation which repeats ON and OFF by PWM control. The driving (switching) of the IGBT 4 enables a power conversion operation. In connection with the switching of the IGBT 4 by PWM control, a ripple current is generated. An anti-parallel diode which is connected in anti-parallel with the switching element is connected to the IGBT 4.

The capacitor 5 is connected in parallel with the IGBT 4. The capacitor 5 is a smoothing capacitor which smoothes a DC voltage. Two DC conductors 2P and 2N are laminated conductors having a thin-plate shape. A surface having a large area in each of the DC conductors 2P and 2N is rectangular. The DC conductors 2P and 2N are shaped as laminated thin-plates to realize low impedance. By arranging two DC conductors 2P and 2N so as to face each other and be as close to each other as possible in a state where they are electrically insulated, low inductance is realized. Other than the IGBT 4 and the capacitor 5, components such as elements necessary for the power conversion circuit may be provided in two DC conductors 2P and 2N. The positive electrode of DC voltage is applied to the positive-electrode DC conductor 2P. The negative electrode of DC voltage is applied to the negative-electrode DC conductor 2N.

With reference to FIG. 2, a method for attaching the IGBTs 4 and the capacitors 5 will be described. FIG. 2 is a diagram viewed from the positive-electrode DC conductor 2P side to which the IGBTs 4 and the capacitors 5 are attached. The positions to which the IGBTs 4 and the capacitors 5 are attached are shown with broken lines.

Many attachment holes 22P and 24P are provided in the positive-electrode DC conductor 2P. Each attachment hole 22P is a hole through which an attachment screw for fixing the positive terminal of the capacitor 5 goes. Each attachment hole 24P is a hole through which an attachment screw for fixing the positive terminal of the IGBT 4 goes.

The positive terminal of the capacitor 5 is fixed by the attachment screw which goes through attachment hole 22P from the negative-electrode DC conductor 2N side (in other words, a side opposite to the surface to which the capacitor 5 is attached). The positive terminal of the IGBT 4 is fixed by the attachment screw which goes through attachment hole 24P from the negative-electrode DC conductor 2N side (in other words, a side opposite to the surface to which the IGBT 4 is attached). The positive terminal of each of the IGBT 4 and the capacitor 5 is fixed by the attachment screws, and is thereby electrically connected to the positive-electrode DC conductor 2P.

Many attachment holes 21N and 23N are provided in the negative-electrode DC conductor 2N. Many through-holes 21P and 23P are provided in the positive-electrode DC conductor 2P. Each attachment hole 21N of the negative-electrode DC conductor 2N and each through-hole 21P of the positive-electrode DC conductor 2P are holes through which an attachment screw for fixing the negative terminal of the capacitor 5 goes. Each attachment hole 23N of the negative-electrode DC conductor 2N and each through-hole 23P of the positive-electrode DC conductor 2P are holes through which an attachment screw for fixing the negative terminal of the IGBT 4 goes. Through-holes 21P and 23P are larger in radius than attachment holes 21N and 23N in order to secure insulation between the attachment screws and the positive-electrode DC conductor 2P.

The negative terminal of the capacitor 5 is fixed by an attachment screw which goes through attachment hole 21N and through-hole 21P in series from the negative-electrode DC conductor 2N side. The negative terminal of the IGBT 4 is fixed by an attachment screw which goes through attachment hole 23N and through-hole 23P in series from the negative-electrode DC conductor 2N side. The negative terminal of each of the IGBT 4 and the capacitor 5 is fixed by the attachment screws, and is thereby electrically connected to the negative-electrode DC conductor 2N.

Many attachment holes 25 are provided in AC conductors 11 for three phases. The AC terminal of the IGBT 4 is fixed by an attachment screw which goes through attachment hole 25 provided in the AC conductor 11. The AC terminal of the IGBT 4 is fixed by the attachment screw, and is thereby electrically connected to the AC conductor 11. The AC conductor 11 is a conductor for connection with the power system 7 shown in FIG. 3. The positive-electrode-side DC-connection bus 3P is electrically connected to the positive-electrode DC conductor 2P. The positive-electrode-side DC-connection bus 3P may be integrally formed with the positive-electrode DC conductor 2P. The positive-electrode-side DC-connection bus 3P electrically connects the positive terminals of the IGBTs 4 and the capacitors 5 to the positive-electrode-side DC bus conductor 6P.

The negative-electrode-side DC-connection bus 3N is electrically connected to the negative-electrode DC conductor 2N. The negative-electrode-side DC-connection bus 3N may be integrally formed with the negative-electrode DC-conductor 2N. The negative-electrode-side DC-connection bus 3N electrically connects the negative terminals of the IGBTs 4 and the capacitors 5 to the negative-electrode-side DC bus conductor 6N.

The DC connection buses 3P and 3N are conductors each having a thin-band shape. The connection sides of the DC connection buses 3P and 3N (upper sides in FIG. 1) are connection terminals for connection with another electric circuit. In FIG. 3, another electric circuit is the DC bus conductor 6P, 6N, or another power conversion unit 1. The DC connection buses 3P and 3N are connected to the DC conductors 2P and 2N in order to go out of a side opposite to a side connected to the DC bus conductors 6P and 6N. Both of the DC connection buses 3P and 3N go through the same negative-electrode DC conductor 2N side and extend in a direction connected to the DC bus conductors 6P and 6N.

Now, the portions in which the DC connection buses 3P and 3N are connected to the DC conductors 2P and 2N will be described.

The DC connection buses 3P and 3N are connected to the DC conductors 2P and 2N on a side opposite to a side connected to the DC bus conductors 6P and 6N in order to ensure a length having inductance for inhibiting a ripple current caused by switching. The structure in which the distance between the DC bus conductors 6P and 6N and the DC conductors 2P and 2N is long enables the DC connection buses 3P and 3N to have a length such that an inductance component is provided between the DC connection buses 3P and 3N and the power conversion circuit including the IGBTs 4 and the capacitors 5. By the inductance component, the ripple current flowing from another power conversion unit 1 is inhibited. Two DC connection buses 3P and 3N have substantially the same length in order to obtain the same inductance.

According to the present embodiment, the ripple current flowing from another power conversion unit 1 can be prevented by structuring the DC connection buses 3P and 3N so as to have a length having an inductance component which inhibits the ripple current caused by switching. In the structure, it is unnecessary to additionally provide an element having an inductance component such as a reactor. Therefore, even if no sufficient space is provided in the unit of the unitized power conversion unit 1, the ripple current flowing from another power conversion unit 1 can be reduced by providing the DC connection buses 3P and 3N.

If attention is focused on only the prevention of flow of ripple current in the power conversion unit 1, a structure in which the DC bus conductors 6P and 6N have an inductance component may be considered. However, if the DC bus-conductors 6P and 6N have an inductance component, the potential variation may be effected. For example, when the inductance between two arbitrary power conversion units 1 is unequal, a large amount of current flows in the power conversion unit 1 having low inductance. If a current flows disproportionally into the specific power conversion unit 1, the structure is unfavorable for the apparatus. The distance between two power conversion units 1 basically differs depending on the combination of the power conversion units 1. Therefore, when an inductance component is provided in the DC bus conductors 6P and 6N by length, the inductance differs depending on the combination of two power conversion units 1.

On the other hand, the DC connection buses 3P and 3N connect the DC bus conductors 6P and 6N to the power conversion circuit of the power conversion unit 1. The distance between the DC bus conductors 6P and 6N and each power conversion circuit can be structured so as to be substantially the same.

Thus, the provision of an inductance component for equally inhibiting the ripple current in each power conversion unit 1 is realized by the provision of an inductance component in the DC connection buses 3P and 3N which connect the DC bus conductors 6P and 6N to the power conversion circuit.

(Second Embodiment)

Figure 4:
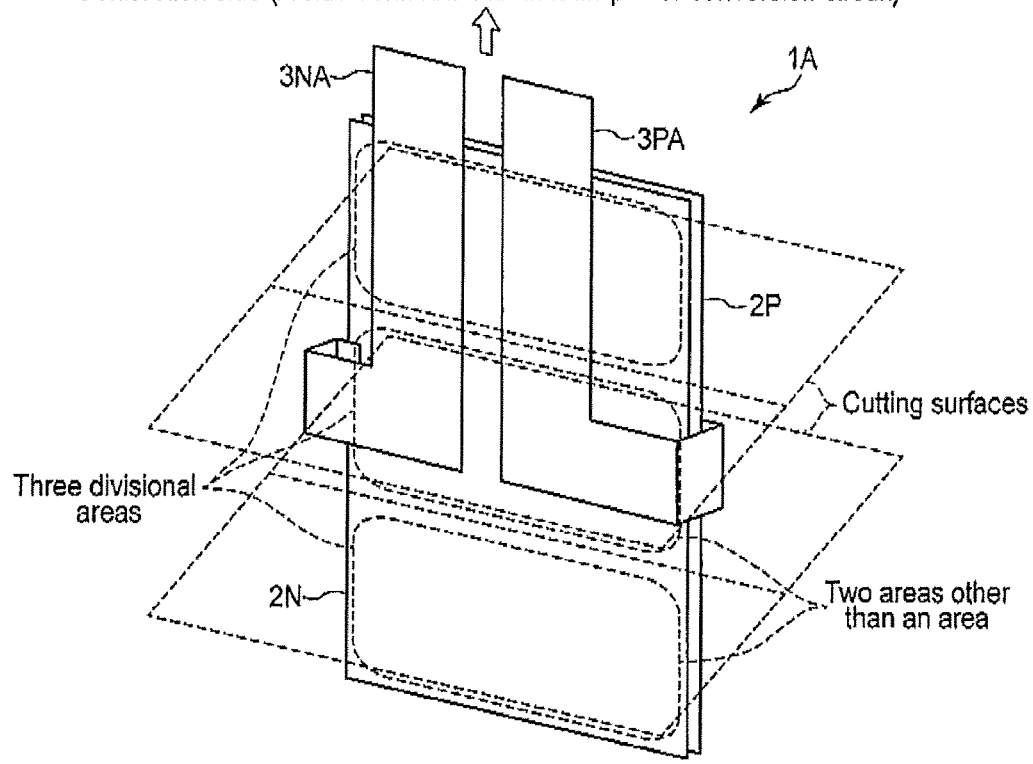
FIG. 4 is a structural diagram showing a structure of a power conversion unit according to a second embodiment of the present invention.

FIG. 4 is a structural diagram showing a structure of a power conversion unit 1A according to a second embodiment of the present invention.

The power conversion unit 1A has a structure where in the power conversion unit 1 according to the first embodiment shown in FIG. 1, the positive-electrode-side DC connection bus 3P and the negative-electrode-side DC connection bus 3N are replaced with a positive-electrode-side DC connection bus 3PA and a negative-electrode-side DC connection bus 3NA respectively.

With respect to two DC connection buses 3PA and 3NA, structures mainly different from two DC connection buses 3P and 3N of the first embodiment are explained in the second embodiment. Explanations of the other structures are omitted as they are identical to the structures of the first embodiment.

Two DC connection buses 3PA and 3NA are connected to central portions of sides located in a direction perpendicular to a direction connected to DC bus conductors 6P and 6N respectively. Each of the central portions refers to a central area out of three divisional areas on a cutting surface perpendicular to a direction connected to the DC bus conductor 6P or 6N. The DC connection buses 3PA and 3NA extend to a central portions of the DC conductors 2P and 2N in a direction perpendicular to a connection direction from portions connected to the DC conductors 2P and 2N respectively. From the central portions, the DC connection buses 3PA and 3NA are bended at a right angle in a connection direction toward a connection side with the DC bus conductors 6P and 6N. In short, when viewed from the negative-electrode DC conductor 2N side, the DC connection buses 3PA and 3NA have an L-shape or a reversed-L-shape.

According to the present embodiment, the following effects can be achieved in addition to the effects obtained from the first embodiment.

The DC connection buses 3PA and 3NA can have an inductance component as the DC connection buses 3PA and 3NA have a length connected to the DC bus conductors 6P and 6N (in other words, the connection points with another power conversion unit 1) from the central portions of the DC conductors 2P and 2N respectively.

The DC connection buses 3PA and 3NA are connected to the central portions of the DC conductors 2P and 2N respectively in order to equalize the electrical distance between all of the electronic components provided in the DC conductors 2P and 2N and the DC bus conductors 6P and 6N. In other words, the connection portions between the DC connection buses 3PA and 3NA and the DC conductors 2P and 2N are configured to be equally distant from elements 4 and 5 connected to arbitrary positions in the DC conductors 2P and 2N, and to be the closest on the outer circumferential sides of the DC conductors 2P and 2N. In this manner, it is possible to equalize the inductance between all of the electronic components provided in the DC conductors 2P and 2N and the DC bus conductors 6P and 6N.

The electrical distance between the electronic components constituting the power conversion circuit and the DC bus conductors 6P and 6N can be further equalized by allocating the electronic components so as to be symmetrical based on the connection portions between the DC connection buses 3PA and 3NA and the DC conductors 2P and 2N, or allocating the elements 4 and 5 on the whole surfaces of the DC conductors 2P and 2N. In addition, electronic components constituting the middle phase out of three phases are allocated in the center based on the connection portions between the DC connection buses 3PA and 3NA and the DC conductors 2P and 2N, and electronic components constituting the other two phases are symmetrically allocated with respect to the center. This structure prevents the unbalance among the phases in the three-phase AC. Apart from this layout, electronic components may be arranged equally from the connection portions between the DC connection buses 3PA and 3NA and the DC conductors 2P and 2N in order to prevent the difference among the phases.

In the above embodiments, each of the DC connection buses 3P and 3N is shaped as a thin band. However, the DC connection bus 3P or 3N is not limited to this shape. For example, a helical shape enables the increase in inductance by short distance. Further, the inductance can be arbitrarily adjusted by elongating the distance or changing the shape.

In the above embodiments, a surface having a large area in the DC conductors 2P and 2N is rectangular. However, the surface is not limited to this shape. For example, the surface may be square, circular, ellipsoidal or have other shapes. In an arbitrary shape, the DC connection buses 3P and 3N can have a length having an inductance component when the DC connection buses 3P and 3N are connected to, out of three areas which are prepared by dividing the DC conductors 2P and 2N on a cutting surface perpendicular to a connection direction with the DC bus conductors 6P and 6N, two areas other than the area which is the closest to the DC bus conductors 6P and 6N. The same effect as the second embodiment can be obtained by connecting the DC connection buses 3P and 3N to the central area out of three areas into which the DC conductors 2P and 2N are divided. Furthermore, when the DC connection buses 3P and 3N are connected to the area which is the closest to the DC bus conductors 6P and 6N, the DC connection buses 3P and 3N can have an inductance component by extra having a length for connecting the DC connection buses 3P and 3N to the DC bus conductors 6P and 6N.

The IGBTs 4 and the capacitors 5 may be located on the negative electrode DC conductor 2N side by allocating, in the negative electrode DC conductor 2N, a through-hole through which an attachment screw for fixing each positive terminal goes.

The power conversion apparatus 10 including four power conversion units 1 (in other words, power conversion circuits) is explained above. However, the number of power conversion units 1 constituting the power conversion apparatus is not limited.

It is to be noted that the present invention is not restricted to the foregoing embodiments, and constituent elements can be modified and changed into shapes without departing from the scope of the invention at an embodying stage. Additionally, various inventions can be formed by appropriately combining a plurality of constituent elements disclosed in the foregoing embodiments. For example, several constituent elements may be eliminated from all constituent elements disclosed in the embodiments. Furthermore, constituent elements in the different embodiments may be appropriately combined.

What is claimed is:

1. A power conversion apparatus comprising: inverter circuits including switching elements outputting DC power to a capacitor;
DC conductors which are provided in each of the inverter circuits and supply a DC power to the inverter circuits, the switching elements being provided on a surface of one of the DC conductors; and
connection conductors connected to the DC conductors and provided in each of the inverter circuits, said connection conductors supplying the DC power from one inverter circuit to other inverter circuits and receiving the DC power from the other inverter circuits, the connection conductors being band shaped and having a width and a length by which the connection conductors exhibit an inductance component which inhibits a ripple current caused by switching of the switching elements; and
DC bus conductors which connect DC sides of the inverter circuits in parallel, wherein the connection conductors connect the DC bus conductors and the DC conductors; and
wherein the DC conductors include three divisional areas consecutively arranged in a connection direction of the DC conductors to the DC bus conductors, the three divisional areas including a first divisional area which is closest to a connection end of the connection conductors to the DC bus conductors, a second divisional area which is most distant from the connection end, and a third divisional area disposed between the first and second divisional areas, and the connection conductors have one end connected to the DC bus conductors and a second end connected to either of the second divisional area or the third divisional area.

2. The power conversion apparatus of claim 1, wherein the surface of each of the DC conductors has a rectangular shape, and
the connection conductors are connected to the DC conductors from a side of the DC conductors, other than a side which is closest to a side connected to another inverter circuit.

3. A method for manufacturing a power conversion apparatus including a first inverter circuit having first and second DC conductors and first switching elements provided on a surface of one of the DC conductors, a second inverter circuit including second switching elements, DC bus conductors which connect DC sides of the first and second inverter circuits in parallel, and connection conductors connected to the DC conductors and provided in each of the inverter circuits, said connection conductors supplying the DC power from one inverter circuit to other inverter circuits and receiving the DC power from the other inverter circuits via the DC bus conductors, said method comprising:
providing connection conductors with first and second ends to connect the first and second DC conductors to the DC bus conductors, the connection conductors being band shaped and having a width and a length by which the connection conductors exhibit an inductance component which inhibits a ripple current caused by switching of the second switching elements of the second inverter circuit;
providing the DC conductors with three divisional areas consecutively arranged in a connection direction of the DC conductors to the DC bus conductors, the three divisional areas including a first divisional area which is closest to a connection end of the connection conductors to the DC bus conductors, a second divisional area which is most distant from the connection end, and a third divisional area disposed between the first and second divisional areas;
connecting the first ends of the connection conductors to the DC bus conductors; and connecting the second ends of connection conductors to either of the second divisional area and third divisional area of said consecutively arranged three divisional areas of said first and second DC conductors.

* * * * *